(12) United States Patent
Dubey et al.

(10) Patent No.: US 12,003,243 B2
(45) Date of Patent: Jun. 4, 2024

(54) LINEAR LOW SIDE RECYCLING MODULATION

(71) Applicant: TEXAS INSTRUMENTS INCORPORATED, Dallas, TX (US)

(72) Inventors: Sumit Dubey, Bengaluru (IN); Jasjot Singh Chadha, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 148 days.

(21) Appl. No.: 17/232,174

(22) Filed: Apr. 16, 2021

(65) Prior Publication Data

US 2021/0234537 A1 Jul. 29, 2021

Related U.S. Application Data

(62) Division of application No. 16/868,104, filed on May 6, 2020, now Pat. No. 11,012,058.

(30) Foreign Application Priority Data

May 7, 2019 (IN) .............................. 201941018191

(51) Int. Cl.
| | | |
|---|---|---|
| *H03K 5/06* | (2006.01) | |
| *H03K 5/15* | (2006.01) | |
| *H03K 5/24* | (2006.01) | |
| *H03K 7/08* | (2006.01) | |
| *H04R 3/00* | (2006.01) | |

(52) U.S. Cl.
CPC ................. *H03K 5/06* (2013.01); *H03K 5/15* (2013.01); *H03K 5/24* (2013.01); *H03K 7/08* (2013.01); *H04R 3/002* (2013.01)

(58) Field of Classification Search
CPC .. H03K 5/06; H03K 5/15; H03K 5/24; H03K 7/08; H03K 5/04; H03K 5/065; H04R 3/002; H04R 3/00
See application file for complete search history.

(56) References Cited

U.S. PATENT DOCUMENTS

| | | | | |
|---|---|---|---|---|
| 8,395,367 | B2 * | 3/2013 | Chien ................... | H02M 3/158 323/288 |
| 2004/0251941 | A1 | 12/2004 | Shi et al. | |
| 2007/0013356 | A1 | 1/2007 | Qiu et al. | |
| 2009/0072807 | A1 | 3/2009 | Qiu et al. | |
| 2009/0278621 | A1 | 11/2009 | Kris et al. | |
| 2011/0193599 | A1 | 8/2011 | Marie | |

(Continued)

*Primary Examiner* — Jung Kim
(74) *Attorney, Agent, or Firm* — John R. Pessetto; Frank D. Cimino

(57) ABSTRACT

A circuit includes a filter, a comparator, and converter. A first input of the comparator couples to the output of the filter. A second input of the comparator is configured to receive ramp signal. An input of the converter couples to the output of the comparator. The circuit also includes a dual minimum pulse generator having an input coupled to the output of the converter. The dual minimum pulse generator is configured to, responsive to an input pulse on the input of the dual minimum pulse generator having a pulse width less than a predetermined delay time period, generate a pulse on the first output of the dual minimum pulse generator that has a pulse width equal to a sum of the pulse width of the input pulse and the predetermined delay time period. A driver is coupled to the output of the dual minimum pulse generator.

13 Claims, 7 Drawing Sheets

(56) References Cited

U.S. PATENT DOCUMENTS

2013/0033319 A1* 2/2013 Chen .................... H03F 3/2173
330/251
2020/0136508 A1 4/2020 Bandyopadhyay et al.

* cited by examiner

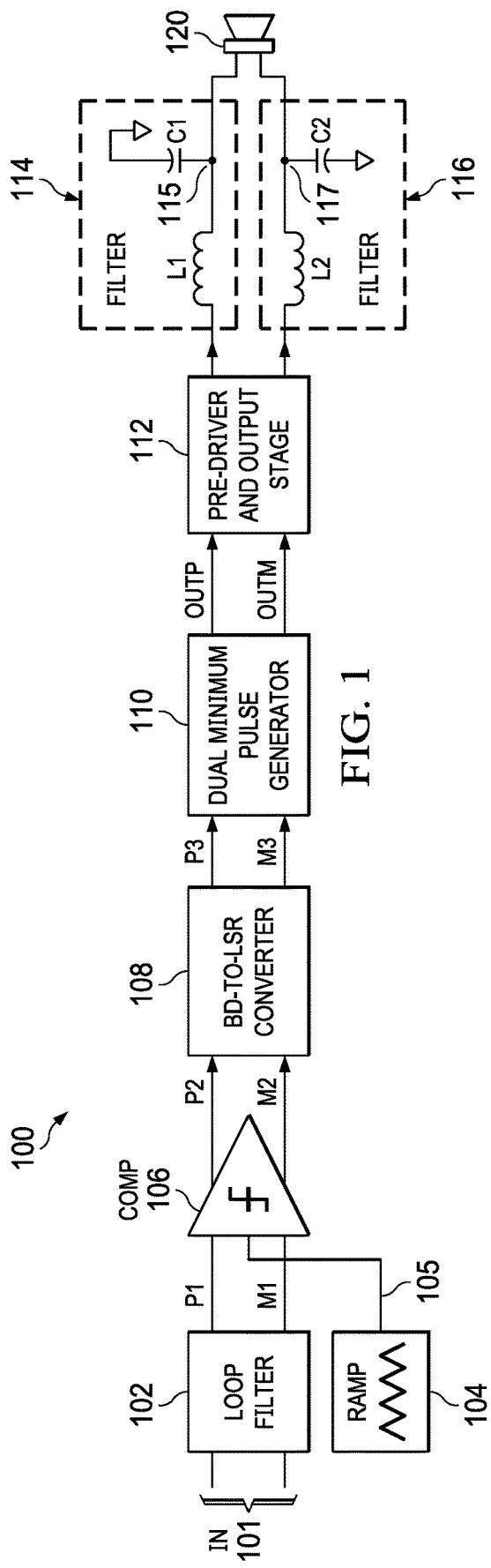
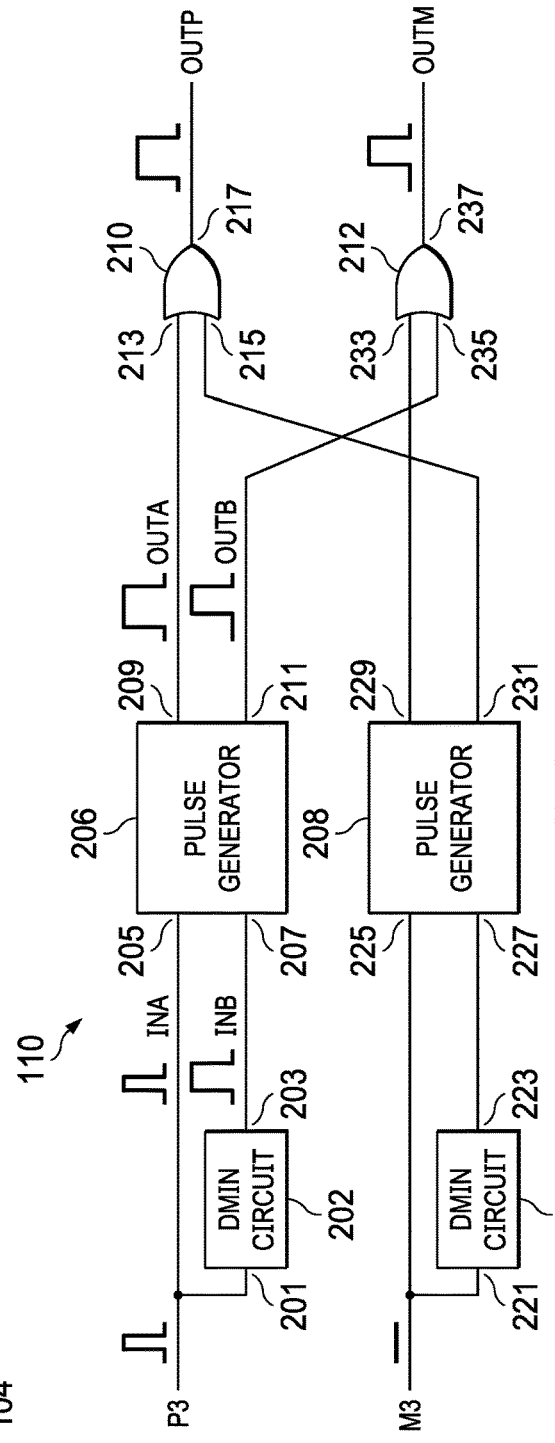
FIG. 1
FIG. 2

US 12,003,243 B2

LINEAR LOW SIDE RECYCLING MODULATION

CROSS-REFERENCE TO RELATED APPLICATIONS

This divisional application claims priority to U.S. patent application Ser. No. 16/868,104, filed May 6, 2020, now U.S. patent Ser. No. 11/012,058, issued May 18, 2021, which claims priority to India Provisional Application No. 201941018191, filed May 7, 2019, both of which are incorporated herein by reference in their entirety.

BACKGROUND

One type of audio signal chain to drive a speaker implements low side recycling (LSR) modulation. LSR modulation advantageously saves power consumed by filters due to reduced clock energy. During the idle channel (i.e., little or no actual audio signal to be processed), the LSR pulse widths can be narrow enough that the output stage of the signal chain adds a relatively high degree of high non-linearity. To reduce or avoid such non-linearity, at least some LSR modulation-based signal chains include a minimum pulse width generator to ensure a minimum pulse width of the LSR signals. However, such minimum pulse width generators add additional differential error as well as common mode error.

SUMMARY

In accordance with at least one example, a circuit includes a filter, a comparator, and converter. A first input of the comparator is coupled to the output of the filter. A second input of the comparator is configured to receive ramp signal. An input of the converter is coupled to the output of the comparator. The circuit also includes a dual minimum pulse generator. An input of the dual minimum pulse generator is coupled to the output of the converter. The dual minimum pulse generator is configured to, responsive to an input pulse on the input of the dual minimum pulse generator having a pulse width less than a predetermined delay time period, generate a pulse on the first output of the dual minimum pulse generator that has a pulse width equal to a sum of the pulse width of the input pulse and the predetermined delay time period. A driver is coupled to the output of the dual minimum pulse generator.

BRIEF DESCRIPTION OF THE DRAWINGS

For a detailed description of various examples, reference will now be made to the accompanying drawings in which:

FIG. 1 illustrates an audio circuit including a dual minimum pulse generator in accordance with an example.

FIG. 2 shows an example implementation of the dual minimum pulse generator of FIG. 1.

DETAILED DESCRIPTION

Figure 3:
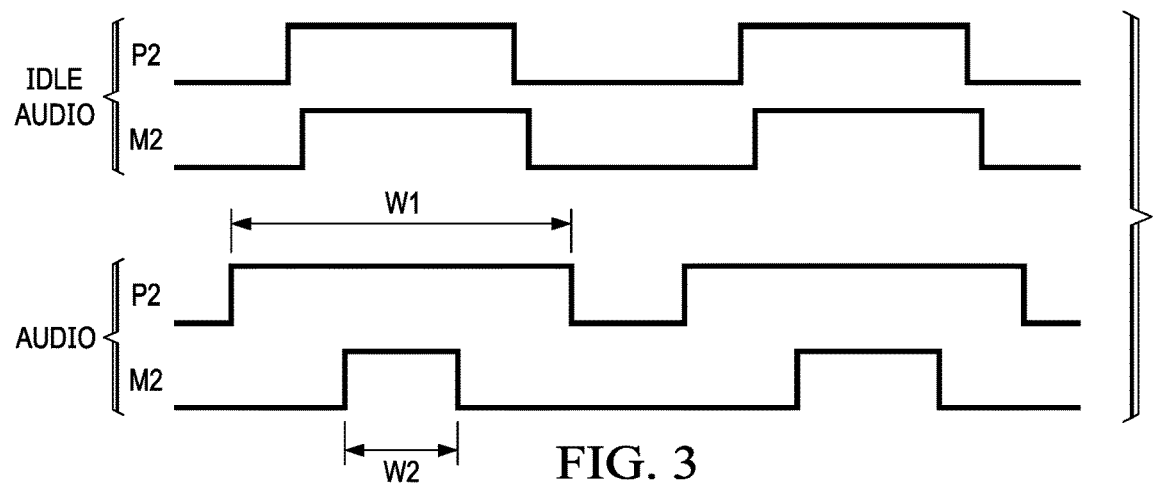
FIG. 3 shows an example timing diagram illustrating BD modulation.

FIG. 1 shows an example of an audio circuit 100 for processing an audio input signal (IN 101) to drive a speaker 120. The audio circuit 100 in this example includes a loop filter 102, a ramp generator 104, a comparator circuit 106, a BD-to-LSR converter 108, a dual minimum pulse generator 110, a pre-driver and output stage 112, and filters 114 and 116. The loop filter 102 includes an input that receives signal IN 101 and includes and an output that provides a positive side (P) output signal P1 and a minus side (M) output signal (M1). The P and M outputs of the loop filter 102 are coupled to respective P and M inputs of the comparator circuit 106. In one example, the comparator circuit 106 comprises two comparators, each comparator having a noninverting input and an inverting input. P1 is provided to the noninverting input of one comparator and M1 is provided to the noninverting input of the other comparator. The comparators' noninverting inputs are coupled to an output of the ramp generator 104. The ramp generator 104 generates a ramp (or triangle wave) signal 105 to be compared to the P1 and M1 signals by comparator circuit 106 to thereby generate comparator output signals P2 and M2. Signals P2 and M2 are BD-modulated signals. In one example, the comparator circuit 106 comprises multiple comparators-one comparator that compares P1 to the ramp signal 105 and another comparator that compares M1 to the ramp signal 105. As such, P2 is high responsive to P1 being larger than the ramp signal 105 and P2 is low otherwise. Similarly, M2 is high responsive to M1 being larger than the ramp signal 105 and low otherwise.

The BD-to-LSR converter 108 converts the BD-modulated signals P2 and M2 to LSR modulated signals P3 and M3. Pulses on P3 occur when P2 is high while M2 is low. Similarly, pulses on M3 occur when M2 is high while P2 is low. During an idle channel (low or no audio), P3 and M3 both have relatively low duty cycles—P3 and M3 have narrow pulses. In one example, the width of the P3 and M3 pulses can be in the range of 100 picoseconds (ps) to 10 nanoseconds (ns). With pulses that narrow, the pre-driver and output stage 112 may add a relatively high level of non-linearity to the performance of the signal chain. As explained below, the dual minimum pulse generator 110 widens the width of the pulses as needed during the idle channel to reduce such added non-linearity while not adding differential error in the signal chain.

The output of the BD-to-LSR converter 108 is coupled to the input of the dual minimum pulse generator 110. As such, P3 and M3 are provided from the BD-to-LSR converter 108 to the dual minimum pulse generator 110. An example implementation of the dual minimum pulse generator 110 and its operation are shown in FIGS. 2-5 and discussed below. The output signals from the dual minimum pulse generator 110 are shown in FIG. 1 as OUTP and OUTM and are provided to corresponding inputs of the pre-driver and output stage 112. The pre-driver and output stage 112 may include power transistors and drive circuitry to control the on/off state of the transistors. The outputs of the pre-driver and output stage 112 are coupled to respective filters 114 and 116. In one example (as illustrated in FIG. 1), filters 114 and 116 comprise bead filters, each including an inductor and a capacitor. Bead filter 114 includes inductor L1 coupled to capacitor C1, and bead filter 116 includes inductor L2 coupled to capacitor C2. The outputs 115 and 117 of the filters 114 and 116 provide the output of the audio circuit 100 and can be coupled to a load, such as a speaker 120.

FIG. 2 shows an example implementation of the dual minimum pulse generator 110. In this example, the dual minimum pulse generator 110 includes delay minimum (DMIN) circuits 202 and 204, pulse generators 206 and 208, and OR gates 210 and 212 (or other type of logic gate(s)). "DMIN" refers to a minimum pulse width implemented by the DMIN circuits. P3 is provided to the input 201 of DMIN circuit 202 and to input 205 of pulse generator 206. The output 203 of DMIN circuit 202 is coupled to input 207 of pulse generator 206. Pulse generator 206 has outputs 209 and 211 which provide respective signals OUTA and OUTB. Output 209 of pulse generator 206 is coupled to input 213 of OR gate 210, and output 211 is coupled to input 235 of OR gate 212. M3 is provided to the input 221 of DMIN circuit 204 and to input 225 of pulse generator 208. The output 223 of DMIN circuit 204 is coupled to input 227 of pulse generator 208. Pulse generator 208 has outputs 229 and 231. Output 229 of pulse generator 208 is coupled to input 233 of OR gate 212, and output 231 is coupled to input 215 of OR gate 210. The output 217 of OR gate 210 and the output 237 of OR gate 212 provide the respective output signals OUTP and OUTM of the dual minimum pulse generator 110.

In one example implementation, DMIN circuit 202 comprises a one-shot circuit which generates an output pulse INB responsive to a rising edge of P3 on input 201 of the DMIN circuit 202. The predetermined pulse width implemented by DMIN circuit 204 may be the same as that for DMIN circuit 202. The pulse width of INB is a pre-defined width (e.g., 40-50 ns). Input 205 of pulse generator 205 receives P3 itself, which may comprise a pulse width that is narrow enough so as, unless addressed by dual minimum pule generator 110, to otherwise cause an increase in non-linearity and noise in the pre-driver and output stage 112. The width of INB from the DMIN circuit 202 is of a pre-determined width and the width of INA (P3) may be narrower than that of INB, such as is illustrated in FIG. 2.

Signals OUTA and OUTB and their pulse widths depend on whether the width of pulse width of P3 is larger or smaller that the predetermined pulse width of INB implemented by DMIN circuit 202. If the pulse width of INP is greater than the predetermined pulse width implemented by DMIN circuit 202, pulse generator 206 generates OUTA to have the same pulse width as INA and generates OUTB to have no pulse (e.g., logic low). However, and as illustrated in FIG. 2, if the width of P3 is smaller than the predetermined pulse width implemented by DMIN circuit 202, then pulse generator 206 generates OUTA (as shown) to have a width that is the sum of the pulse width of INA and the predetermined pulse width implemented by DMIN circuit 202 in generating INB, and generates OUTB to have a pulse width equal to that of INB. The example of FIG. 2 shows an example of this latter case in which the width of OUTA is the sum of the pulse widths of INA and INB, and the pulse width of OUTB equals the pulse width of INB. OR gate 210 logically ORs OUTA and the signal on input 215 (which is low in this example because M3 has no pulse), and thus, for the latter case (INA having width smaller than the width of INB), the width of OUTP is equal to the width of OUTA The combination of DMIN circuit 204, pulse generator 208, and OR gate 212 functions in much the same way as the combination of DMIN circuit 202, pulse generator 206, and OR gate 210 described above. The example of FIG. 2 illustrates that M3 has no pulse coincident with the pulse on P3. As such, the output 223 of DMIN circuit 204 is logic low (i.e., no pulse) and inputs 225 and 227 of pulse generator 208 are logic low (no pulses). The signal on the output 231 of pulse generator 208 is provided to input 215 of OR gate 210 and logically OR'd with OUTA as explained above. The width of OUTB from pulse generator 206 (in the face of a pulse on P3) is the same as the predetermined width implemented by the DMIN circuit 202. OUTB is provided to the input 235 of OR gate 212, and thus OUTM from OR gate 212 comprises a pulse that equals the width implemented by the DMIN circuit 202.

OUTP and OUTM thus both have pulses with the width of OUTP being larger than the width of OUTM, in the example of a pulse on P3 but not on M3. The width of OUTP is the sum of the pulse widths of P3 and the predetermined pulse width implemented by DMIN circuit 202. The width of OUTM is the width implemented by the DMIN circuit 202 (via pulse generator 206).

In the opposite case in which M3 has a pulse and P3 does not, the signaling through the dual minimum pulse generator 110 is largely the same as that described above with the roles being reversed between DMIN circuit 204/pulse generator 208/OR gate 212 and DMIN circuit 202/pulse generator 206/OR gate 210. In this case, OUTP and OUTM both have pulses with the width of OUTM being larger than the width of OUTM. The width of OUTM in this case will be the sum of the pulse width of M3 and the pulse width implemented by the DMIN circuit 204, and the width of OUTP will be the predetermined pulse width implemented by the DMIN circuit 204 (via pulse generator 208).

Figure 4:
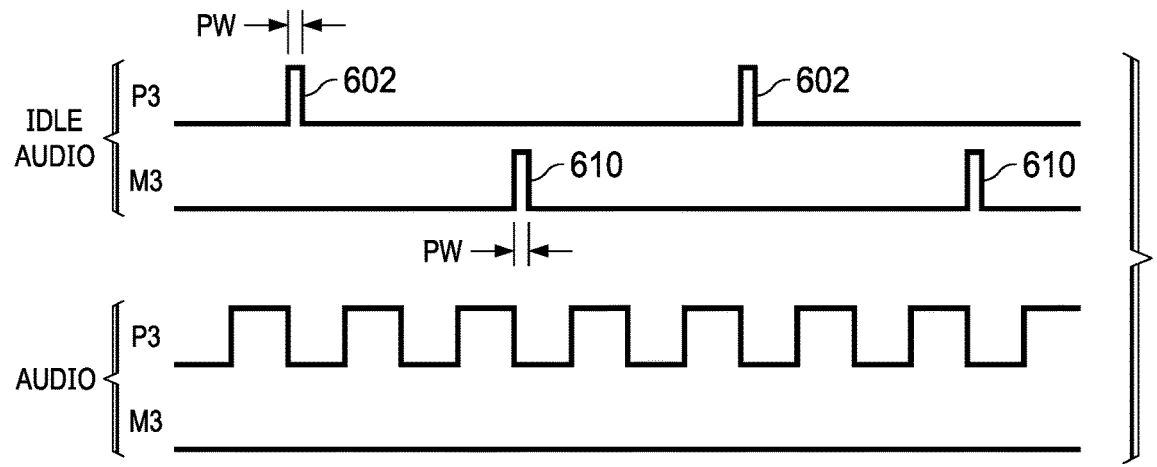
FIG. 4 shows an example timing diagram illustrating LSR modulation.
Figure 5:
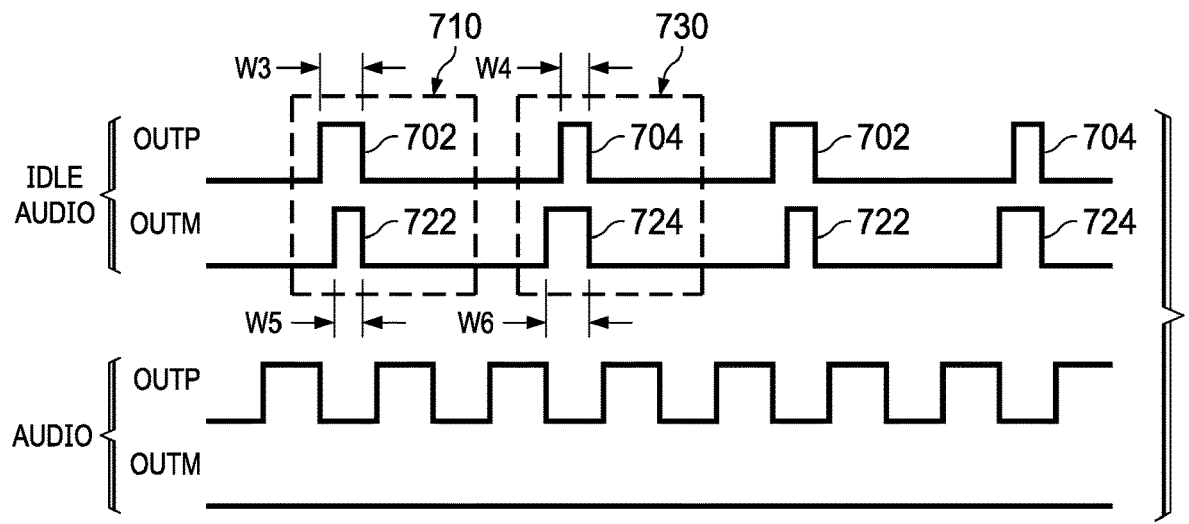
FIG. 5 shows an example timing diagram illustrating the output of the dual minimum pulse generator of FIG. 1.

FIGS. 3-5 show example timing diagrams illustrating the operation of the audio circuit 100. FIG. 3 illustrates BD-modulated signals P2 and M2 in the case of an idle audio channel (upper pair of illustrative waveforms) and P2 and M2 in the case of an audio channel with an actual audio signal (lower pair of illustrative waveforms). With a small or zero audio signal (upper pair of waveforms), the difference in voltages of P1 and M1 (FIG. 1) is small or zero and thus, because P1 and M1 are being compared to the same ramp signal 105, P2 and M2 are equal or almost equal to each other as illustrated in the upper pair of waveforms. With an audio signal being present, the difference in voltage of P1 is different than that of M1 to reflect the size of the audio signal. As such, the high phases of the P2 signal output by comparator circuit 106 has a different length than the high phases of the M2 signal as shown in the lower waveforms. As shown, P2 has a large high phase (W1) than the high phase (W2) of OUTM.

FIG. 4 shows examples of LSR-modulated P3 and M3 signals (output by the BD-to-LSR converter 108) during an idle channel (upper waveforms) and in the presence of an audio signal (lower waveforms). During an idle channel, P3 includes a series of relatively narrow pulses 602. Similarly, M3 has a series of relatively narrow pulses 610. In this example, the width of narrow pulses 602 may be approximately the same as the width of narrow pulses 610. M3 pulses 610 do not occur at the same time as P3 pulses 602.

FIG. 5 illustrates the output signals OUTP and OUTM produced by the dual minimum pulse generator 110 during idle channel (upper waveforms) and in the presence of an audio signal (lower waveforms). During an idle channel, the widths of the OUTP and OUTM pulses are wider than the narrow pulses 602 and 610 of P3 and M3 (FIG. 4). The pulses of OUTP comprise alternating wider and narrower pulses 702 and 704, and the pulses of OUTM comprise alternating narrower and wider pulses 722 and 724. OUTP pulses 702 have widths W3 that are wider than widths W4 of OUTP pulses 704. OUTM pulses 722 have widths W5 that are narrower than widths W6 of OUTM pulses 724. The pair of pulses 710 comprises a wider OUTP pulse 702 and a narrower OUTM pulse 722 (i.e., narrower than the pulse width of OUTP pulse 702) which occur at the same time. These pulses are reflected in the example of FIG. 2 as shown on the outputs of OR gates 210 and 212. These pulses occur when P3 has a pulse width that is narrower than the predetermined pulse width implemented by the DMIN circuit 202 and M3 has no pulse. FIG. 5 also shows a pair of pulses 730 comprising a wider OUTM pulse 724 and a narrower OUTP pulse 704 (i.e., narrower than the pulse width of OUTM pulse 704) which occur at the same time. These pulses have occurred when PM has a pulse with a width that is narrower than the predetermined pulse width implemented by the DMIN circuit 204 and P3 has no pulse.

As explained above, narrow P3 and M3 pulses are "widened" by the dual minimum pulse generator 110. The dual minimum pulse generator 110 does not add any differential error into the signal chain and adds fixed common mode bias at both the P and M sides of the signal chain for each narrow width pulse (e.g., as illustrated at 710 and 730).

Figure 6:
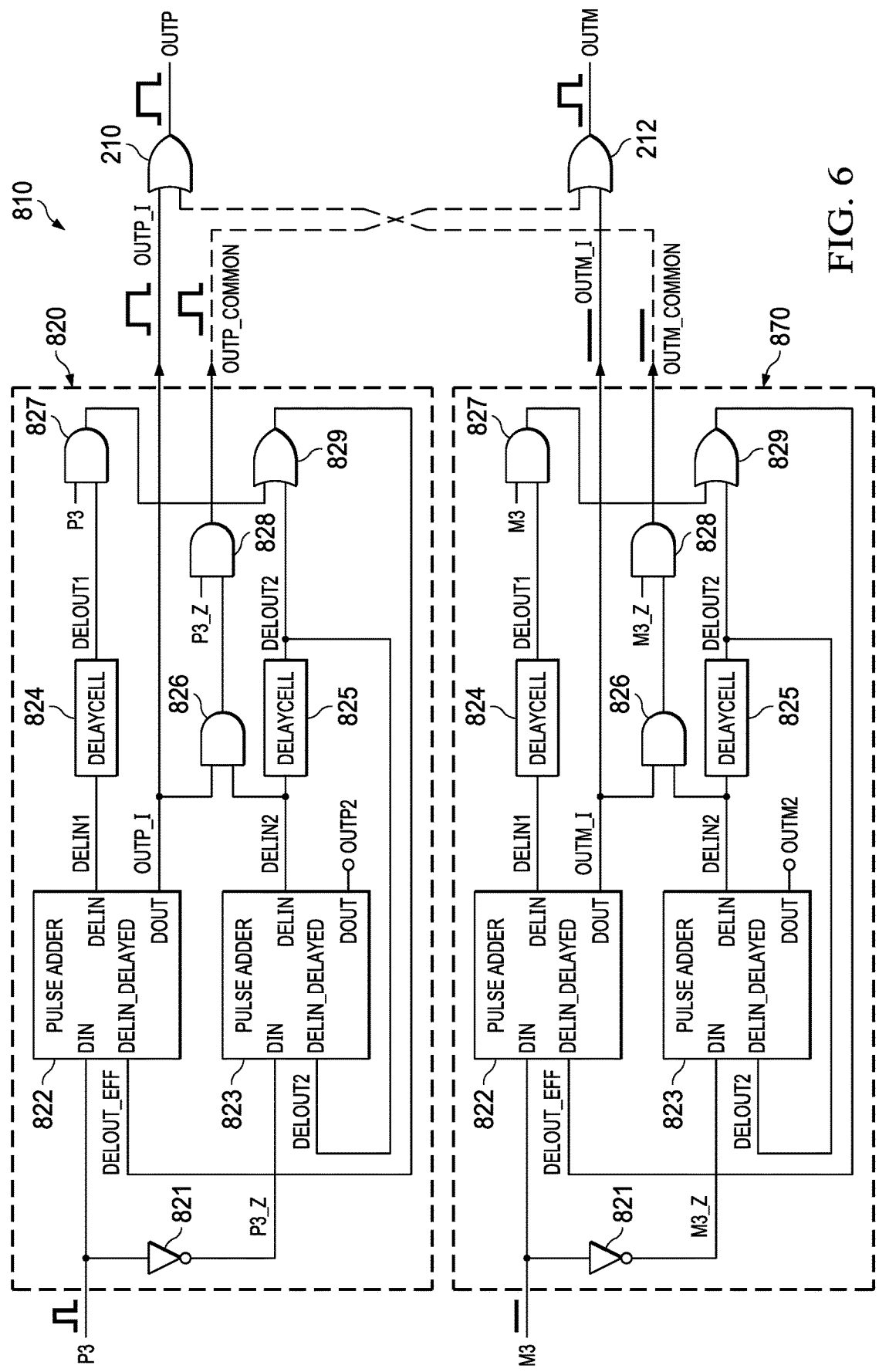
FIG. 6 shows another example implementation of the dual minimum pulse generator of FIG. 1.

FIG. 6 shows another example implementation of the dual minimum pulse generator 110—enumerated in FIG. 6 by reference number 810. Dual minimum pulse generator 810 in FIG. 6 includes circuits 820 and 870 and OR gates 210 and 212. Circuits 820 and 870 are generally identical to each other—circuit 820 process signal P3 and circuit 870 process signal M3. Circuit 820 is discussed herein, and the explanation applies equally to circuit 870.

Figure 7:
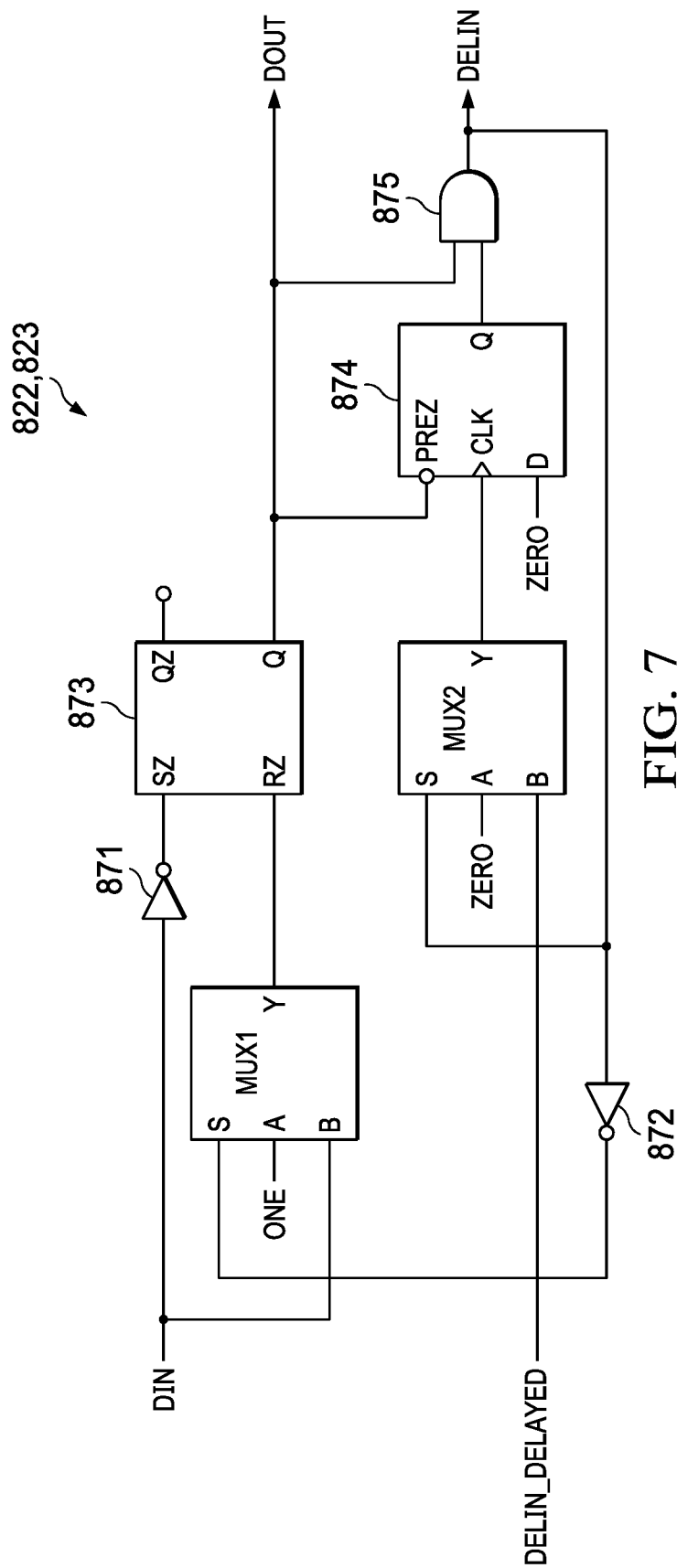
FIG. 7 shows an example of a pulse adder included in the dual minimum pulse generator of FIG. 6.

The example circuit 820 of FIG. 6 includes an inverter 821, pulse adders 822 and 823, delay cells 824 and 825, AND gates 826-828, and OR gate 829. An example of pulse adders 822 and 823 is shown in FIG. 7 and described below. Each pulse adder 822, 823 includes inputs DIN and DELIN_DELAYED and outputs DOUT and DELIN. P3 is coupled to the input of inverter 821 and to the DIN input of pulse adder 822. The DELIN output of pulse adder 822 includes a signal labeled DELIN1 and is coupled to an input of delay cell 824. Each delay cell 825 and 825 generates an output signal that tracks its input signal but with a predetermined delay time period—the DMIN delay period. The output of delay cell 824 includes a signal labeled DELOUT1 and is coupled to an input of AND gate 827. Another input of AND gate 827 receives the input signal P3. The output of AND gate 827 is coupled to an input of OR gate 829.

Inverter 821 inverts the logic state of P3 and the output of inverter 821 includes a signal labeled P3_Z (which is the inverse of P3). The output of inverter 821 is coupled to the DIN input of pulse adder 823. The DELIN output of pulse generator 823 provides a signal labeled DELIN2 and is coupled to an input of delay cell 825. Delay cell 825 imposes the same DMIN delay period as delay cell 824. The output of delay cell 825 provides a signal labeled DELOUT2 and is coupled to the other input of OR gate 829. The output of delay cell 825 also is coupled to the DELIN_DELAYED input of pulse adder 823. The output of OR gate 829 provides a signal labeled DELOUT_EFF and is coupled to the DELIN_DELAYED input of pulse adder 822.

The DOUT output from pulse adder 822 provides a signal labeled OUTP_I, which is coupled to an input of OR gate 210 and is also coupled to and input of AND gate 826. The DELIN output (DELIN2) of pulse adder 823 is coupled to another input of AND gate 826. The output of AND gate 826 is coupled to an input of AND gate 828, and the other input of AND gate 828 receives P3_Z (the output signal from inverter 821). The output of AND gate 828 provides a signal labeled OUTP_COMMON, which is provide to an input of OR gate 212.

The OUTM_I signal from the DOUT output of pulse adder 822 within circuit 870 is coupled to an input of OR gate 212. The output from AND gate 828 of circuit 870 provides a signal labeled OUTM_COMMON and is coupled to an input of OR gate 210. The output of OR gate 210 provides the OUTP signal and the output of OR gate 212 provides the OUTM signal.

Each pulse adder 822, 823 generates an output pulse on its DOUT output in response to an input pulse on its DIN input. The width of the pulse on DOUT is equal to the width of a pulse on DIN as long as pulse width of DIN is equal or larger than DMIN (DMIN is the delay time period implemented by delay cells 824 and 825). If the DIN pulse width is smaller than DMIN, then the pulse adder 822, 823 generates an output pulse on DOUT that is equal to the sum of the pulse width of DIN and the DMIN period.

Figure 8:
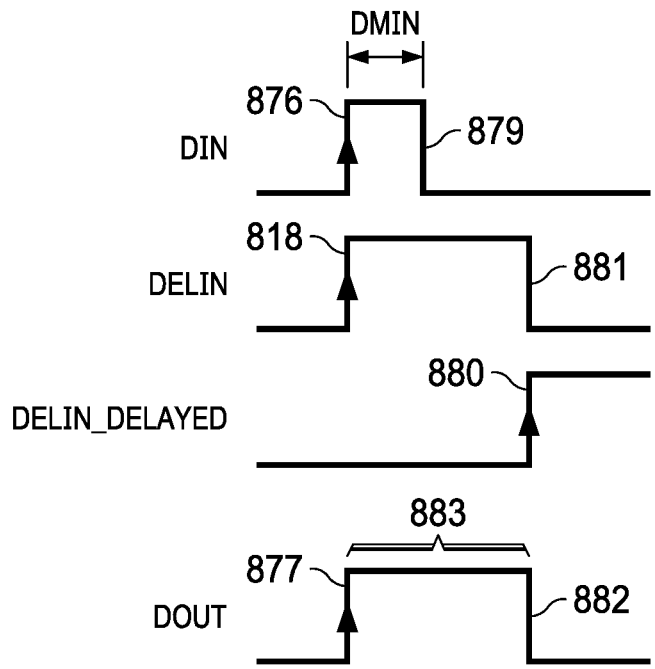
FIG. 8 shows a timing diagram pertaining to the operation of the pulse adder of FIG. 7 for the case in which an input pulse width is less than a minimum pulse width.
Figure 9:
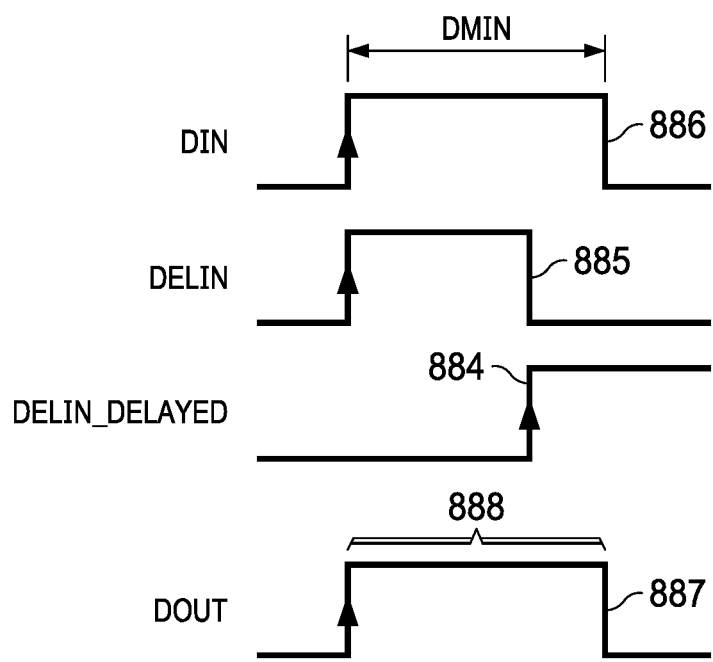
FIG. 9 shows a timing diagram pertaining to the operation of the pulse adder of FIG. 7 for the case in which the input pulse width is larger than the minimum pulse width.

FIG. 7 provides an example implementation of pulse adders 822, 823. FIGS. 7 and 8 provide example timing diagrams illustrating the operation of the pulse adder when the pulse width of DIN is smaller than DMIN (FIG. 8) and when the pulse width of DIN is larger than DMIN (FIG. 9). Referring first to FIG. 7, the pulse adder includes multiplexers MUX1 and MUX2, inverters 871 and 872, latch 873, data (D) flip-flop 874, and AND gate 875. MU1 includes A and B inputs and a selection input S. The Y output of MUX1 is equal to the signal on the A or B inputs based on the logic state selection S. One logic state (e.g., 0) on the S input selects the A input and the other logic state (e.g. 1) on the S input selects the B input. MUX2 functions in much the same way (i.e., S=0 selects the A and S=1 selects the B input).

The latch 873 includes a set input SZ, a reset input RZ, and a Q output. When SZ is low ("0"), the latch is set and Q becomes high ("1"). When RZ becomes low, the latch is reset and Q becomes low ("0"). D flip-flop 874 includes a D input, a clock input, a PREZ input, and a Q output. The D input is tied low as shown, and thus when the D flip-flop is clocked (rising edge on its clock input), the Q output of the D flip-flop is forced low. When the signal on PREZ is low, the Q output of the D flip-flop is forced high.

DIN is coupled to the input of inverter 871 and to the B input of MUX1. The A input of MUX1 is tied high. The Y output of MUX1 is coupled to the RZ input of latch 873. The output of inverter 871 is coupled to the SZ input of latch 873. The Q output of latch 873 provides DOUT and is coupled to the PREZ input of D flip-flop 874 and to an input of AND gate 875. The output of AND gate 875 provides DELIN and is coupled to an input of inverter 872. The output of inverter 872 drives the selection (S) input of MUX1. The A input of MUX2 is tied low (0) and the B input of MUX2 receives DELIN_DELAYED. The Y output of MUX2 is couple to and drives the clock input of the D flip-flop 974.

Referring now to FIG. 7 and to the timing diagram of FIG. 8 (pulse width of DIN being less than DMIN), a pulse for DIN is shown beginning at rising edge 876. As DIN becomes high, the SZ input of latch 873 is pulled low thereby setting the latch and forcing its Q output (DOUT) high as shown at 877. DOUT being high also presets D flip-flop 874 forcing its Q output high. In response, DELIN from AND gate 875 becomes high as illustrated at 878.

With DELIN being high, the S input of MUX1 is 0 thereby selecting the A input. With the A input being tied high, the Y output of MUX1 is high. As such the RZ input of latch 873 is forced high. DELIN also drives the S input of MUX2 and thus selects the B input of MUX2. The pulse on DIN ends with a falling edge at 879. A low DIN forces the SZ input of latch 873 high. DOUT remains high despite SZ being forced high. To force DOUT back to a low level, the latch 873 must be reset by pulling its RZ input low. The RZ input of latch 873 is driven by the Y output of MUX1. DELIN_DELAYED (explained below) is initially low and then transitions to a high logic state at 880.

Before DELIN_DELAYED becomes high at 880, DELIN is high and the B input of MUX2 is selected. At that point, DELIN_DELAYED is low and thus the clock input of D flip-flop is low. The D flip-flop is clocked in response to a rising edge on its clock input. When DELIN_DELAYED becomes high at 880, the high level of DELIN_DELAYED propagates through MUX2 to provide a rising edge on the clock input of D flip-flop 874. As the D input is tied low, clocking the D flip-flop 874 causes its Q output to become 0 which, through AND gate 875, causes DELIN to transition low as illustrated at 881.

In response to DELIN being low, the output of inverter 872 is high and the S input of MUX1 selects the B input of MUX1. The B input of MUX1 receives DIN, which by this point in time is low. The Y output of MUX1 becomes low which then causes the latch 873 to reset thereby forcing DOUT low as illustrated at 882. As such DOUT becomes high when DIN experiences a rising edge (876). DOUT becomes low in response to DELIN_DELAYED becoming low (880) which causes DELIN to become low (881). The width 883 of the pulse on DOUT is equal to the width of the pulse on DIN plus DMIN, as will be further explained below.

FIG. 9 illustrates the operation of pulse adder 822, 823 when the width of the pulse on DIN is larger than DMIN. The operation of the pulse adder is largely the same as described above until the time that that DELIN is forced low at 885 in response to DELIN_DELAYED transitioning to a low level at 884. When DELIN becomes low in this example, DIN is still high. As such, both the A and B inputs of MUX1 at this point in time have high inputs—the A input is tied high and the B input is high due to DIN being high when falling edge 885 occurs. The B input of MUX1 is selected in response to DELIN becoming low and thus the output of inverter 872 becoming high. The Y output of MUX1 remains high as both the A and B inputs are high when the S input changes state.

Eventually DIN experiences a falling edge 886. With DIN then being low, the B input of MUX1 is low and the latch's RZ input becomes low resetting the latch 873 and forcing DOUT low at 887. The width 888 of the pulse on DOUT is the same as the width of the DIN pulse.

Figure 10:
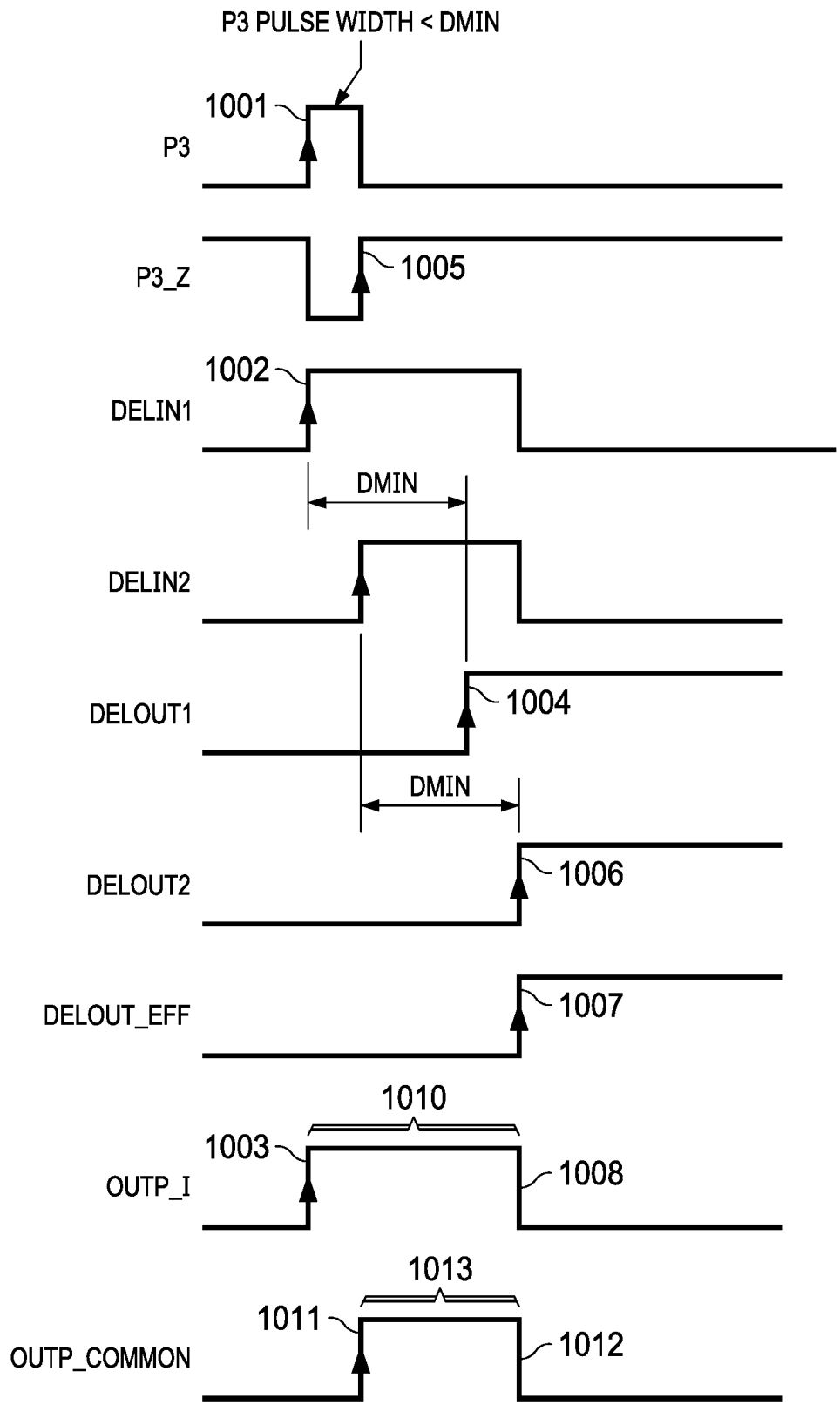
FIG. 10 shows a timing diagram pertaining to the operation of the dual minimum pulse generator of FIG. 6 for the case in which the input pulse width is less than a minimum pulse width.

FIG. 10 illustrates a timing diagram for the circuit of FIG. 6 for the case in which the pulse width of P3 is less than DMIN. Referring to FIG. 6 and the timing diagram of FIG. 10, the rising edge 1001 of P3 causes a rising edge 1002 of DELIN1 to occur, as described above regarding inverter 871 and latch 873 of pulse adder 822 of circuit 820. The rising edge 1001 of P3 also the Q output of latch 873 within the pulse adder 822 of circuit 820 to become high and thus OUTP_I becomes high as indicated by rising edge 1003 in FIG. 10.

DELIN1 is provided to delay cell 824 in circuit 820. As such, the rising edge 1002 of DELIN1 causes a rising edge 1004 on DELOUT1 after a period of time implemented by the delay cell 824—the DMIN time period. The inputs of AND gate 827 within circuit 820 are never both high at the same time for the case in which the pulse width of P3 is less than DMIN. As such, the output of AND gate remains low.

P3_Z is the logical inverse of P3 and the rising edge 1005 of P3_Z, which corresponds to the end of the pulse on P3, causes a rising edge on DELIN2 via the pulse adder 823 of circuit 820. DELOUT2 from delay cell 825 of circuit 820 is a delayed version (DMIN time period) of DELIN2 and thus DELOUT2 transitions high as indicated by rising edge 1006. Responsive to DELOUT2 being high, the output of OR gate 829 of circuit 820 (i.e., signal DELOUT_EFF) becomes high at edge 1007.

DELOUT_EFF is provided to the DELIN_DELAYED input of pulse adder 822 and, via MUX2, causes the D flip-flop 874 to be clocked thereby forcing DELIN1 low (falling edge 1009). With DELIN1 being low, the B input of MUX1 is selected. DIN (P3) is low by this point in time and the latch 873 is reset thereby forcing DOUT (OUTP_I) low as indicated by falling edge 1008. As such, the pulse width 1010 of OUTP_I is equal to the width of the pulse of P3 plus the DMIN time period implemented by delay cell 825.

OUTP_COMMON is the output signal from AND gate 828. OUTP_COMMON will be high when all three of P3_Z, OUTP_I, and DELIN2 are high. As such, rising edge 1011 on OUTP_COMMON thus occurs when upon the rising edges of P3_Z and DELIN2 (OUTP_I is already high by that point in time). OUTP_COMMON will transition low when any of the P3_Z, OUTP_I, or DELIN2 signals are low. Falling edge 1008 of OUTP_I thus causes falling edge 1012 of OUTP_COMMON. The pulse width 1013 of OUTP_COMMON is equal to DMIN. As a result, the pulse width 1010 of OUTP_I is DMIN plus the pulse width of P3, and the pulse width of OUTP_COMMON is DMIN.

If M3 does not have a pulse (as indicated in the example of FIG. 6), both OUTM_I and OUTM_COMMON are low, as shown. The output of OR gate 210 comprises OUTP_I, and thus has a pulse width equal to DMIN plus the pulse width of P3. The output of OR gate 212 comprises OUTP_COMMON and thus has a pulse width of DMIN. The same functionality described above also occurs with respect to circuit 870 responsive to a pulse on M3, with P3 remaining low, in which case, the output of OR gate 212 will have a pulse width a pulse width equal to DMIN plus the pulse width of P3, and the output of OR gate 210 will have a pulse width equal to DMIN.

Figure 11:
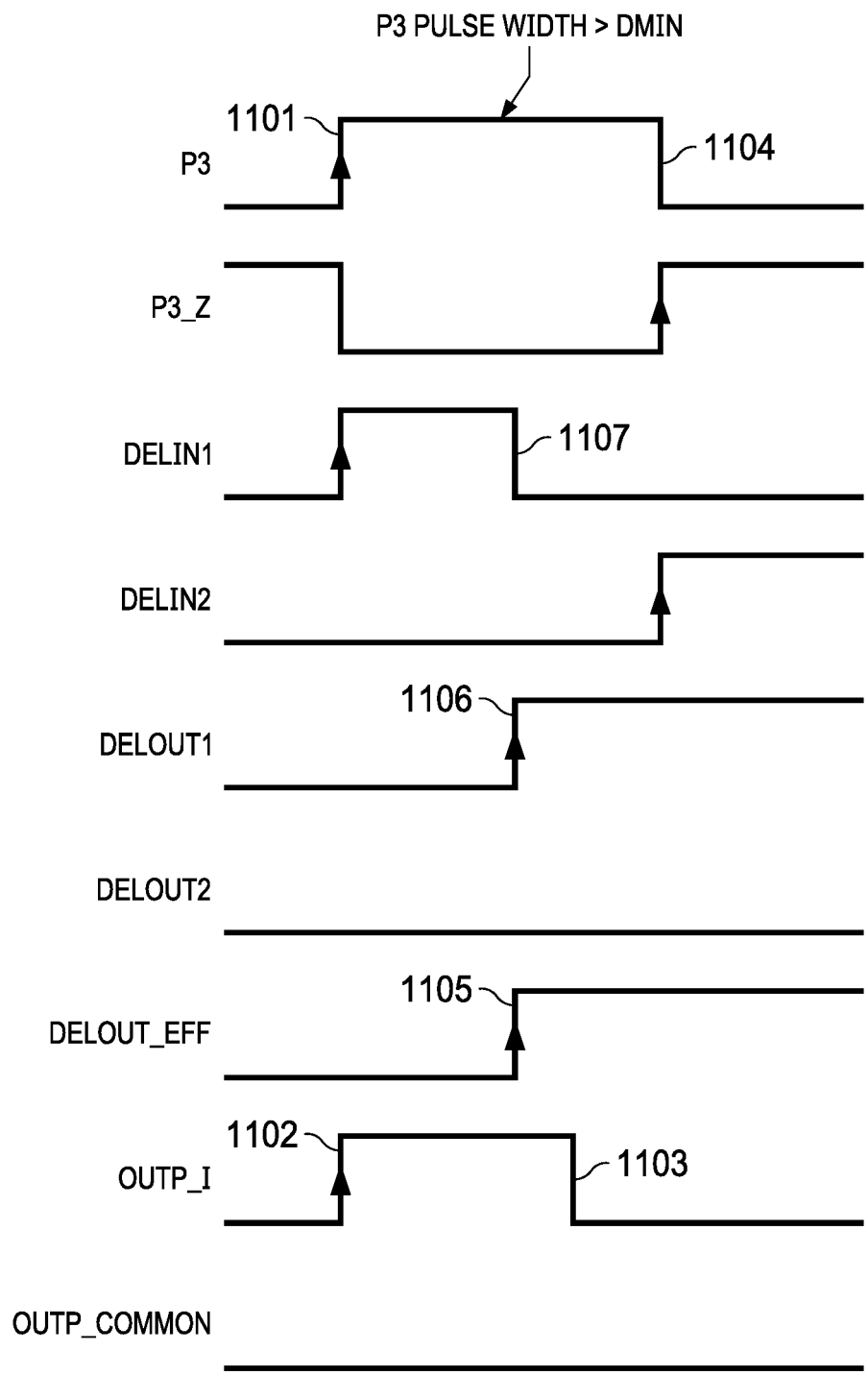
FIG. 11 shows a timing diagram pertaining to the operation of the dual minimum pulse generator of FIG. 6 for the case in which the input pulse width is larger than the minimum pulse width.

FIG. 11 provides an example in which the pulse with of P3 is larger than DMIN. As explained above, OUTP_I becomes high at edge 1102 responsive to rising edge 1101 on P3. OUTP_I has a falling edge at 1103 responsive to the falling edge 1104 on P3. The rising edge 1105 of DELOUT_EFF, which occurs when DELOUT1 becomes high (1106) at which time P3 is still high and thus the output of AND gate 827 is high. The high on the output of AND gate 827 causes DELOUT_EFF from OR gate 829 to become high (1105). DELOUT_EFF becoming high clocks D flip-flop 874 within pulse adder 822 of circuit 820 thereby forcing DELIN1 low (1107). DELIN1 being low causes MUX1 to select its B input. The B input receives P3 on the DIN input of pulse adder 822. Because P3 is still high when DELIN1's falling edge 1107 occurs, the reset input of latch 873 remains high. The reset input transitions low upon occurrence of P3's falling edge 1104. The latch resets and OUTP_I transitions low (1103). FIG. 11 also illustrates that there is not a point in time in which all of P3_Z, OUTP_I, and DELIN2 are high. As such, OUTP_COMMON remains low The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   a filter having an input and an output;
   a comparator having first and second inputs and an output, the first input of the comparator is coupled to the output of the filter and the second input of the comparator is configured to receive ramp signal;
   a converter having an input and an output, the input of the converter is coupled to the output of the comparator;
   a dual minimum pulse generator having an input and first and second outputs, the input is coupled to the output of the converter, the dual minimum pulse generator is configured to, responsive to an input pulse on the input of the dual minimum pulse generator having a pulse width less than a predetermined delay time period, generate a pulse on the first output of the dual minimum pulse generator that has a pulse width equal to a sum of the pulse width of the input pulse and the predetermined delay time period; and
   a driver having an input and an output, the input of the driver is coupled to the first output of the dual minimum pulse generator.

2. The circuit of claim 1, wherein responsive to the input pulse on the input of the dual minimum pulse generator having a pulse width less than the predetermined delay time period, generate a pulse on the second output of the dual minimum pulse generator that has a pulse width equal to the predetermined delay time period.

3. The circuit of claim 1, wherein responsive to the input pulse on the input of the dual minimum pulse generator having a pulse width greater than the predetermined delay time period, generate a pulse on the first output of the dual minimum pulse generator that has a pulse width equal to the predetermined delay time period.

4. The circuit of claim 1, wherein the dual minimum pulse generator includes:
   a first pulse adder having first and second inputs and first and second outputs;
   a second pulse adder having first and second inputs and first and second outputs;
   a first delay cell having an input and an output, the input of the first delay cell is coupled to the second output of the first pulse adder;
   a second delay cell having an input and an output, the input of the second delay cell is coupled to the second output of the second pulse adder, and the output of the second delay cell is coupled to the second input of the second pulse adder;
   a first inverter having an input and an output, the input of the first inverter is coupled to the first input of the first pulse adder, and the output of the first inverter is coupled to the first input of the second pulse adder.

5. The circuit of claim 1, further comprising a speaker coupled to the driver.

6. The circuit of claim 1, wherein the converter is a BD-to-low side recycling converter.

7. The circuit of claim 1, wherein the dual minimum pulse generator includes a delay cell having an input and an output, and the delay cell is configured to generate a signal on the output of the delay cell is a delayed version of a signal on the input of the delay cell, an amount of delay implemented by the delay cell being equal to the predetermined delay time period.

8. A circuit, comprising:
   a filter having an input and an output;
   a comparator having first and second inputs and an output, the first input of the comparator is coupled to the output of the filter and the second input of the comparator is configured to receive ramp signal;
   a converter having an input and an output, the input of the converter is coupled to the output of the comparator;
   a dual minimum pulse generator having an input and first and second outputs, the input is coupled to the output of the converter; and
   a driver having an input and an output, the input of the driver is coupled to the first output of the dual minimum pulse generator;
   wherein the dual minimum pulse generator includes:
   a first pulse adder having first and second inputs and first and second outputs;
   a second pulse adder having first and second inputs and first and second outputs;
   a first delay cell having an input and an output, the input of the first delay cell is coupled to the second output of the first pulse adder;
   a second delay cell having an input and an output, the input of the second delay cell is coupled to the second output of the second pulse adder, and the output of the second delay cell is coupled to the second input of the second pulse adder;
   a first inverter having an input and an output, the input of the first inverter is coupled to the first input of the first pulse adder, and the output of the first inverter is coupled to the first input of the second pulse adder.

9. The circuit of claim 8, wherein responsive to an input pulse on the input of the dual minimum pulse generator having a pulse width less than a predetermined delay time period, the circuit generates a pulse on the second output of the dual minimum pulse generator that has a pulse width equal to the predetermined delay time period.

10. The circuit of claim 8, wherein responsive to an input pulse on the input of the dual minimum pulse generator having a pulse width greater than a predetermined delay time period, the circuit generates a pulse on the first output of the dual minimum pulse generator that has a pulse width equal to the predetermined delay time period.

11. The circuit of claim 8, further comprising a speaker coupled to the driver.

12. The circuit of claim 8, wherein the converter is a BD-to-low side recycling converter.

13. The circuit of claim 8, wherein the dual minimum pulse generator includes a delay cell having an input and an output, and the delay cell is configured to generate a signal on the output of the delay cell that is a delayed version of a signal on the input of the delay cell, an amount of delay implemented by the delay cell being equal to the a predetermined delay time period.

* * * * *